United States Patent
Yu et al.

(10) Patent No.: US 9,536,850 B2
(45) Date of Patent: Jan. 3, 2017

(54) PACKAGE HAVING SUBSTRATE WITH EMBEDDED METAL TRACE OVERLAPPED BY LANDING PAD

(71) Applicant: Taiwan Semiconductor Manufacturing Company, Ltd., Hsin-Chu (TW)

(72) Inventors: Chen-Hua Yu, Hsin-Chu (TW); Mirng-Ji Lii, Sinpu Township (TW); Chen-Shien Chen, Zhubei (TW); Yu-Jen Tseng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/791,160

(22) Filed: Mar. 8, 2013

(65) Prior Publication Data

US 2014/0252598 A1   Sep. 11, 2014

(51) Int. Cl.
*H01L 23/00* (2006.01)
*H01L 23/498* (2006.01)

(52) U.S. Cl.
CPC ......... *H01L 24/14* (2013.01); *H01L 23/49838* (2013.01); *H01L 24/11* (2013.01); *H01L 24/13* (2013.01); *H01L 24/16* (2013.01); *H01L 24/81* (2013.01); *H01L 2224/0401* (2013.01); *H01L 2224/05567* (2013.01); *H01L 2224/05624* (2013.01); *H01L 2224/131* (2013.01); *H01L 2224/13014* (2013.01); *H01L 2224/13022* (2013.01); *H01L 2224/13082* (2013.01); *H01L 2224/13144* (2013.01); *H01L 2224/13565* (2013.01); *H01L 2224/13686* (2013.01); *H01L 2224/16237* (2013.01); *H01L 2224/16238* (2013.01); *H01L 2224/73204* (2013.01); *H01L 2224/81191* (2013.01); *H01L 2224/81385* (2013.01); *H01L 2224/81815* (2013.01);
(Continued)

(58) Field of Classification Search
CPC ........ H01L 23/52; H01L 23/28; H01L 23/535; H01L 25/162; H01L 24/16; H01L 2924/00014; H01L 24/11; H01L 24/14; H01L 2021/60022; H01L 2225/06513
USPC ........................................................ 257/737
See application file for complete search history.

(56) References Cited

U.S. PATENT DOCUMENTS 5,686,762 A * 11/1997 Langley ................. H01L 24/05
257/775
6,413,620 B1 * 7/2002 Kimura .................... H05K 3/20
174/251
6,433,427 B1   8/2002 Wu et al.
(Continued)

FOREIGN PATENT DOCUMENTS

CN   101681900 A   3/2010
EP   2480058   7/2012
(Continued)

*Primary Examiner* — Peniel M Gumedzoe
(74) *Attorney, Agent, or Firm* — Slater Matsil, LLP

(57) ABSTRACT

A package and method of making the package are provided. An embodiment package includes an integrated circuit supporting a conductive pillar, a substrate having a landing pad on each embedded metal trace, a landing pad width greater than a corresponding embedded metal trace width, and a conductive material electrically coupling the conductive pillar to the landing pad. In an embodiment, the landing pad overlaps the metal trace in one direction.

19 Claims, 9 Drawing Sheets

(52) U.S. Cl.
CPC   *H01L 2924/181* (2013.01); *H01L 2924/3512* (2013.01); *H01L 2924/3841* (2013.01)

(56) References Cited

U.S. PATENT DOCUMENTS

| | | | | |
|---|---|---|---|---|
| 7,436,063 | B2* | 10/2008 | Miyata et al. | 257/738 |
| 7,750,250 | B1* | 7/2010 | Kuo | 174/264 |
| 8,030,750 | B2* | 10/2011 | Kim et al. | 257/690 |
| 8,318,537 | B2* | 11/2012 | Pendse | 438/108 |
| 8,536,718 | B2* | 9/2013 | Ko et al. | 257/787 |
| 2006/0055021 | A1* | 3/2006 | Yamamoto | H01L 23/49822 257/690 |
| 2007/0029663 | A1* | 2/2007 | Kim et al. | 257/700 |
| 2008/0061436 | A1* | 3/2008 | Yang | H01L 23/3114 257/738 |
| 2008/0303152 | A1* | 12/2008 | Zhang | 257/738 |
| 2009/0102047 | A1* | 4/2009 | Chen et al. | 257/737 |
| 2009/0149016 | A1* | 6/2009 | Park et al. | 438/614 |
| 2009/0206493 | A1* | 8/2009 | Pendse | 257/782 |
| 2009/0266598 | A1* | 10/2009 | Katagiri et al. | 174/261 |
| 2010/0055846 | A1* | 3/2010 | Lii et al. | 438/124 |
| 2010/0117207 | A1* | 5/2010 | Hsiao et al. | 257/676 |
| 2011/0248399 | A1* | 10/2011 | Pendse | 257/737 |
| 2012/0091577 | A1* | 4/2012 | Hwang et al. | 257/737 |
| 2012/0098120 | A1* | 4/2012 | Yu et al. | 257/737 |
| 2012/0161330 | A1* | 6/2012 | Hlad et al. | 257/774 |
| 2012/0241946 | A9 | 9/2012 | Pendse | |
| 2012/0273934 | A1* | 11/2012 | Shieh et al. | 257/737 |
| 2012/0306104 | A1* | 12/2012 | Choi et al. | 257/782 |
| 2013/0062755 | A1* | 3/2013 | Kuo et al. | 257/737 |

FOREIGN PATENT DOCUMENTS

| | | |
|---|---|---|
| KR | 1020050019419 | 3/2005 |
| KR | 20100044205 | 4/2010 |
| KR | 20120062598 | 6/2012 |

* cited by examiner

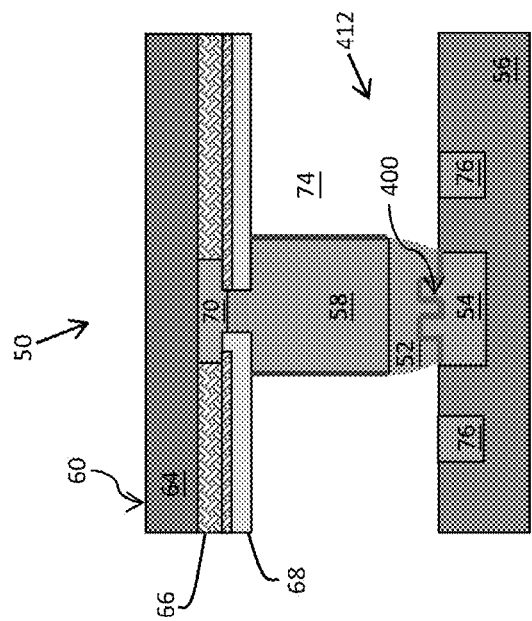
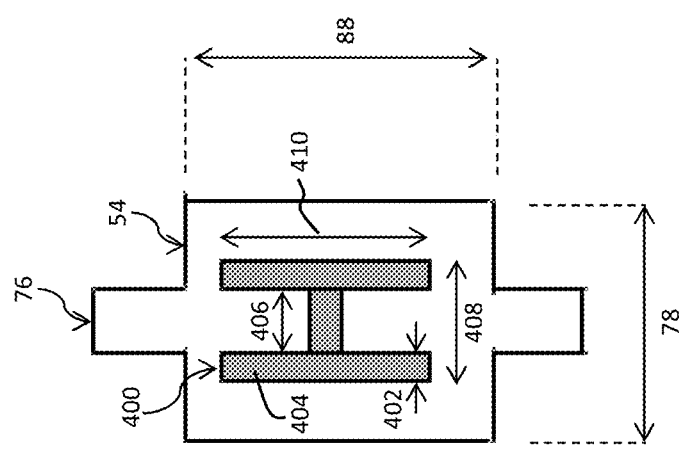
Fig. 13
Fig. 12 ural appliances such as smart phones and tablet com-
PACKAGE HAVING SUBSTRATE WITH EMBEDDED METAL TRACE OVERLAPPED BY LANDING PAD

BACKGROUND

Semiconductor packages have been continuously improved to meet new demands for high-performance, small-size and high-speed electronic appliances. Accordingly, semiconductor packages have been evolved from old-fashioned dual in-line packages (DIPs) to state-of-the-art semiconductor packages such as CSPs. As a result, electronic appliances such as smart phones and tablet computers can be miniaturized using the CSPs as their components.

The CSPs are particularly ideal or suitable for ideal for a package having a large number of pins (e.g., 100+) with high speed operation or for a package having a relatively large size chip. Although the definition of the CSPs has not been fixed in semiconductor industry, the packages that are smaller than about 120% of the size of a semiconductor chip are typically referred to as a CSP. Even semiconductor packages larger than 120% of the size of a chip, such as ball grid array (BGA) packages, land grid array (LGA) packages, and small outline non-leaded (SON) packages, may be considered to be a CSP. In particular, the BGA packages having solder balls instead of leads mounted on the lower surface thereof, the LGA packages having a land array mounted on the lower surface thereof, and the SON packages having two land arrays instead of leads mounted on the lower surface thereof are examples of the CSPs.

In a package such as a flip chip Chip Scale Package (fcCSP), an integrated circuit (IC) may be mounted to a substrate (e.g., a printed circuit board (PCB) or other integrated circuit carrier) through a bump on trace (BOT) interconnection.

In light of the demand for ever smaller packages, attempts are often made to reduce the distance between adjacent bumps, which is known as the bump pitch. One way to reduce the bump pitch is by shrinking the width of the metal traces used in the BOT interconnection. Unfortunately, reducing the width of the metal traces may lead to undesirable or detrimental consequences.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 12 illustrates a top view of a joint enhancement layer formed over the landing pad overlapping the metal trace;

FIG. 13 illustrates a cross section of an embodiment package having an embedded patterning process (EPP) substrate with a joint enhancement layer formed over the landing pad overlapping each metal trace;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the disclosure provides many applicable inventive concepts that can be embodied in a wide variety of specific contexts. The specific embodiments discussed are merely illustrative and do not limit the scope of the disclosure.

The present disclosure will be described with respect to embodiments in a specific context, namely a flip chip Chip Scale Package (fcCSP) incorporating a bump on trace (BOT) interconnection. The concepts in the disclosure may also apply, however, to other packages, interconnection assemblies, or semiconductor structures.

Figure 1:
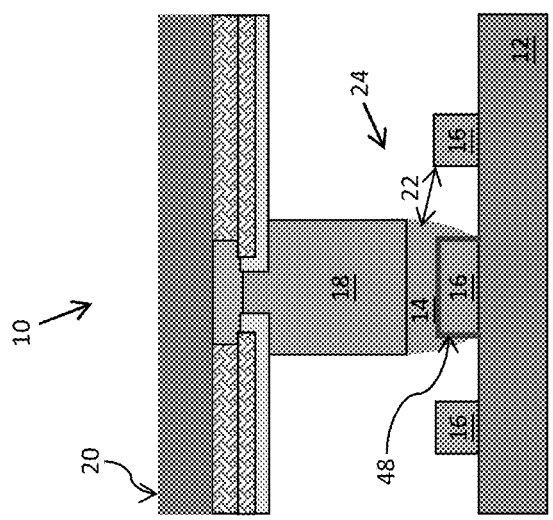
FIG. 1 illustrates a cross section of package having a semi-additive process (SAP) substrate for reference.

Referring now to FIG. 1, a package 10 having a semi-additive process (SAP) substrate 12 is illustrated for reference. As shown, a conductive material 14 (e.g., solder feature, solder joint) electrically couples metal traces 16 on the substrate 12 to a conductive pillar 18 supported by an integrated circuit (IC) chip 20. If the distance 22 between the conductive material 14 in the bump on trace (BOT) interconnection 24 and an adjacent metal trace 16 in FIG. 1 is too small, an undesirable bridging may occur during reflow and lead to a yield loss.

Figure 2:
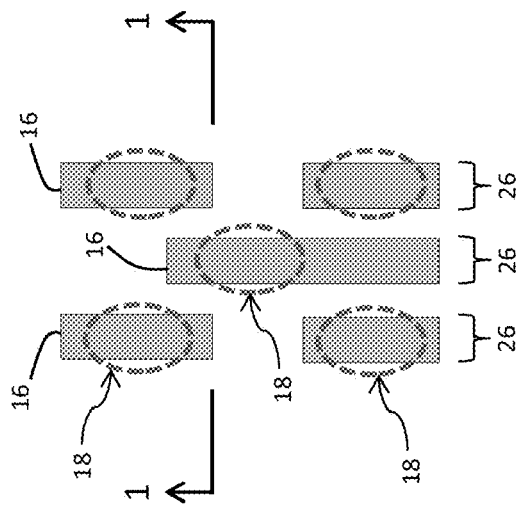
FIG. 2 illustrates a top view of a metal trace pattern relative to a conductive pillar from the package of FIG. 1.

Referring to FIG. 2, a top view of a pattern of the metal traces 16 relative to corresponding conductive pillars 18 is provided. When a line width 26 of the metal traces 16 in the package 10 of FIG. 1 is reduced to about fifteen micrometers (15 µm) or less, the metal traces 16 may detrimentally peel away from the substrate 12 due to the limited contact area between the metal traces 16 and the substrate 12.

Figure 3:
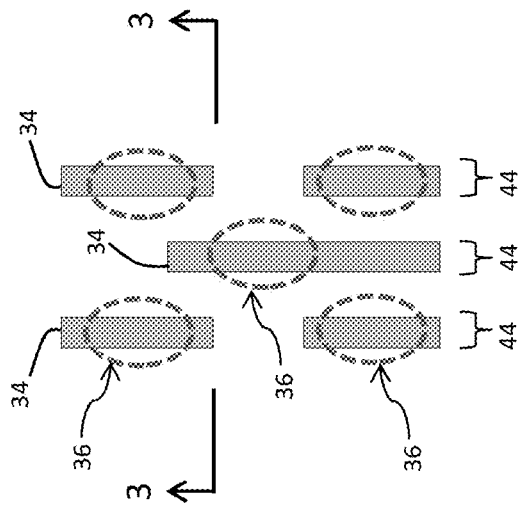
FIG. 3 illustrates a cross section of a package having an embedded patterning process (EPP) substrate for reference.

To mitigate the bridging issue potentially afflicting the package 10 of FIG. 1, a package 28 employing an embedded patterning process (EPP) substrate 30 as shown in FIG. 3 may be used. In FIG. 3, a conductive material 32 (e.g., solder feature, solder joint) electrically couples metal traces 34 embedded in the substrate 30 to a conductive pillar 36 supported by an integrated circuit (IC) chip 38.

Because the metal traces 34 in FIG. 3 are embedded in the substrate 30, a distance 40 between the conductive material 32 in the bump on trace (BOT) interconnection 42 and an adjacent metal trace 34 is increased relative to the distance 22 between similar features in FIG. 1. Therefore, unintended bridging may be prevented.

Figure 4:
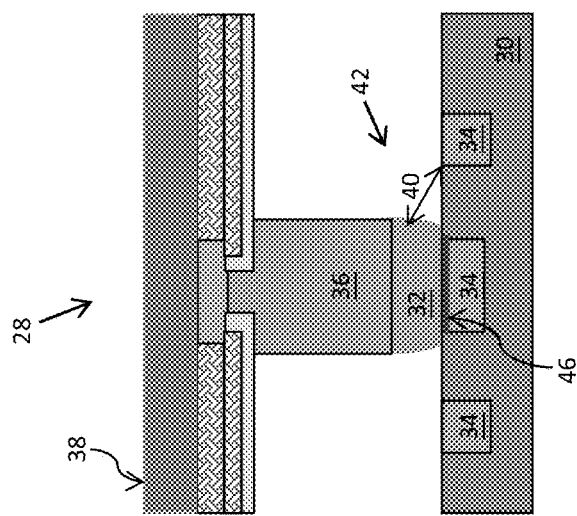
FIG. 4 illustrates a top view of a metal trace pattern relative to a conductive pillar from the package of FIG. 3.

As shown in FIG. 4, a line width 44 of the embedded metal traces 34 may be reduced to about ten micrometers (10 μm) or less. However, doing so shrinks a joint area 46 between the embedded metal trace 34 and the conductive material 32 in the BOT interconnection 42. Because the joint area 46 in FIG. 3 is smaller than a joint area 48 between the metal trace 16 and the conductive material 14 in FIG. 1, the package 28 in FIG. 3 may more easily suffer from joint fatigue or solder cracks. Indeed, solder cracks may undesirably form during a bonding process or a reliability test.

Figure 5:
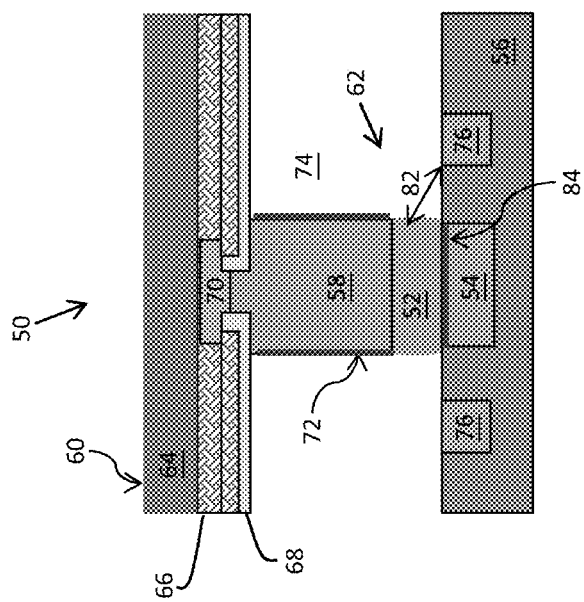
FIG. 5 illustrates a cross section of an embodiment package having an embedded patterning process (EPP) substrate with a landing pad overlapping each metal trace.

Referring now to FIG. 5, an embodiment package 50 is illustrated. As shown, the embodiment package 50 includes a conductive material 52 (e.g., solder joint) that electrically couples a landing pad 54 in the embedded patterning process (EPP) substrate 56 to a conductive pillar 58 supported by an integrated circuit (IC) chip 60. As will be more fully explained below, the landing pad 54 generally provides the embodiment package 50 with a more robust and more reliable bump on trace (BOT) interconnection 62.

As shown in FIG. 5, the integrated circuit chip 60 includes an integrated circuit interconnect layer 64, a passivation layer 66, and a buffer layer 68. In a practical application, the integrated circuit 60 may include additional layers, structures, or features. However, such additional layers, structures, or features have been omitted from FIG. 5 for ease of illustration as they are not believed to be necessary to an understanding of the present disclosure.

As shown in FIG. 5, the integrated circuit interconnect layer 64, the passivation layer 66, and the buffer layer 68 partially encapsulate and otherwise support a redistribution layer 70. In an embodiment, the redistribution layer 70 is an aluminum pad.

Still referring to FIG. 5, the redistribution layer 70 is electrically coupled to the conductive pillar 58 (e.g., metal bump). In an embodiment, the conductive pillar 58 is formed from a metal or metal alloy, which permits a metal oxide 72 to form on sidewalls of the conductive pillar 58. In those embodiments where metal oxide 72 is present, adhesion with a molding compound/underfill material 74 disposed around the conductive pillar 58 and between the integrated circuit chip 60 and the substrate 56 is improved relative to when no such metal oxide 72 exists. In an embodiment, the conductive pillar 58 is formed from copper and the metal oxide 72 is a copper oxide.

Figure 6:
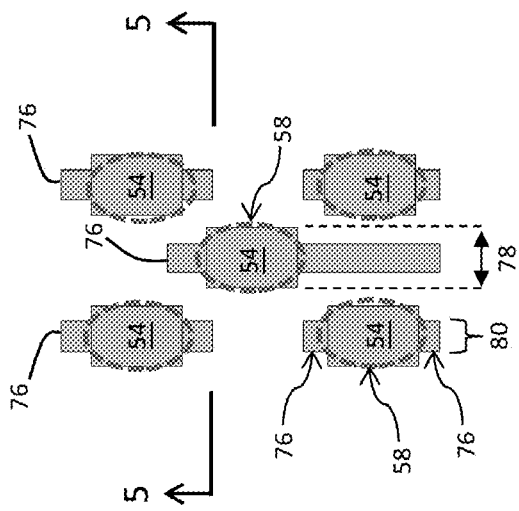
FIG. 6 illustrates a top view of a landing pad and metal trace pattern relative to a conductive pillar from the package of FIG. 5.

Referring now to FIGS. 5-6, at least one of the landing pads 54 is provided for each of the metal traces 76. As shown, a landing pad width 78 is greater than a line width 80 of the embedded metal traces 76. In other words, each landing pad 54 generally overlaps its corresponding metal trace 76 in one direction (i.e., from left to right as oriented in FIG. 6). As such, each landing pad 54 provides a wider potential connection area for use in the BOT interconnection 62. In other words, the conductive material 52 of the conductive pillar 58 is provided with more area of contact. Indeed, as shown in FIG. 6, in an embodiment a footprint of the landing pad 54 generally corresponds in size and dimension to a footprint of the conductive pillar 58.

Still referring to FIG. 6, in an embodiment the landing pads 54 are staggered. In other words, adjacent landing pads 54 are offset from each other (vertically as oriented in FIG. 6). Therefore, the distance between adjacent metal traces 76 associated with the landing pads 54 may be reduced. In an embodiment, the landing pads 54 and the metal traces 76 are unitarily formed. The landing pads 54 and the metal traces 76 may be formed, for example, in the same metal depositing step or in separate process steps.

By incorporating the landing pad 54 into the package 50 as shown in FIGS. 5-6, the line width 80 of the metal traces 76 may be kept relatively small. Indeed, in an embodiment the line width 80 of the metal traces 76 is about ten micrometers (10 μm) or less. As such, the bump to trace distance 82 shown in FIG. 5 may also remain relatively small, which allows for a smaller overall package 50. Even so, the joint area 84 between the landing pad 54 and the conductive material 52 remains relatively large because of the wider contact area provided by the landing pad 54 relative to the much narrower metal trace 76. The large joint area 84 mitigates or eliminates joint fatigue and helps prevent solder cracks in the embodiment package 50.

Figure 7:
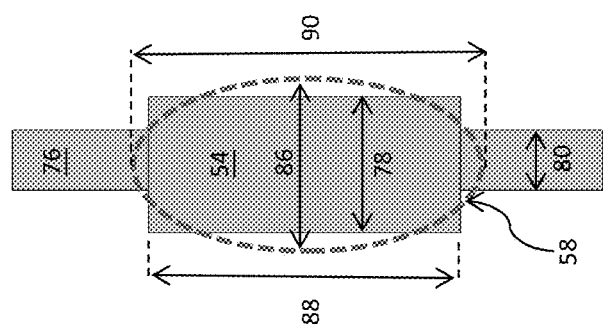
FIG. 7 illustrates one of the landing pads used in the embodiment package of FIGS. 3A-3B in further detail.

Referring now to FIG. 7, one of the landing pads 54 and one of the metal traces 76 within the package 50 of FIG. 5 is illustrated in further detail. In an embodiment, the landing pad width 78 is greater than the metal trace width 80 and less than or equal to a conductive pillar width 86. In addition, in an embodiment a landing pad length 88 is less than or equal to a conductive pillar length 90. In an embodiment, the landing pad length 88 is between about seventy percent of the conductive pillar length 90 to about one hundred thirty percent of the conductive pillar length 90. Even so, the landing pad 54, the metal trace 76, and the conductive pillar 58 may have other sizes and dimensions in other embodiments.

Figure 8:
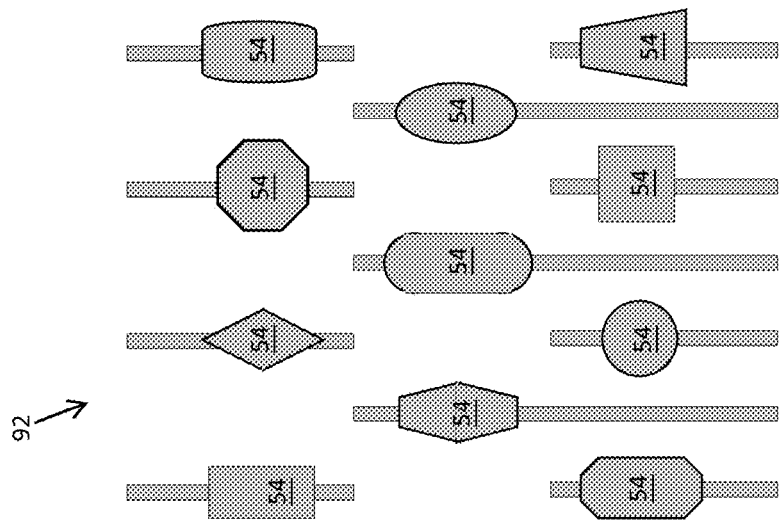
FIG. 8 illustrates examples of suitable shapes for the landing pads used in the embodiment package of Figure.

Referring now to FIG. 8, examples 92 of suitable shapes for the landing pads 54 are illustrated. As shown in FIG. 8, in an embodiment the landing pads 54 may have the shape of a rectangle, square, triangle, trapezoid, hexagon, octagon, and ellipse. The landing pads 54 may also have the shape of a ladder shape, a diamond, a rounded rectangle, a double trapezoid, a capsule, an oval, and a hexagon-ended rectangle. It should be recognized that the suitable shapes provided in FIG. 8 is intended to be illustrative and not exhaustive. In other words, other symmetrical or non-symmetrical shapes may be used to form the landing pads 54.

Figure 9:
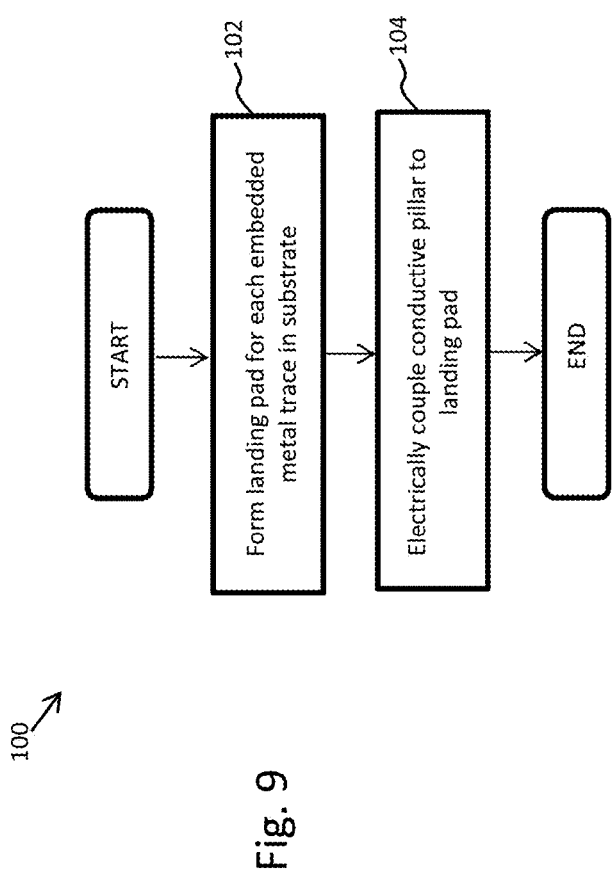
FIG. 9 illustrates a method of forming the embodiment package of FIG. 5.

Referring now to FIG. 9, an embodiment method 100 of forming the embodiment package 50 of FIG. 5 is provided. In block 102, a landing pad is formed for each embedded metal trace in a substrate. A pad width is greater than a corresponding trace width. In block 104, the conductive pillar of an integrated circuit chip is electrically coupled to the landing pad.

Figure 10:
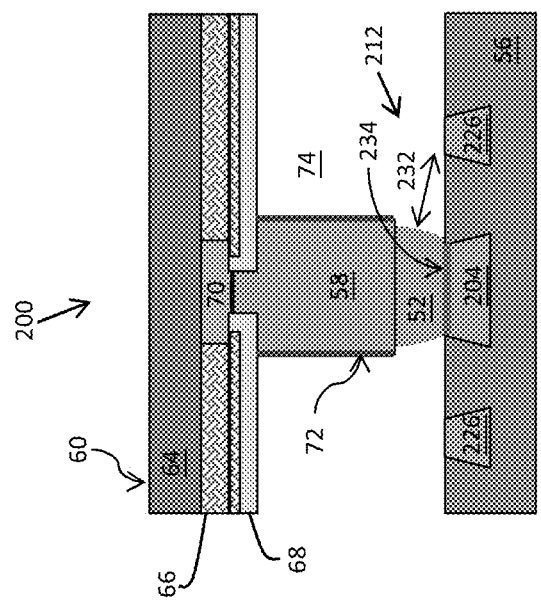
FIG. 10 illustrates a cross section of an embodiment package having an embedded patterning process (EPP) substrate with a landing pad overlapping each trapezoid-shaped metal trace.

Referring now to FIG. 10, an embodiment package 200 having a trapezoid-shaped landing pad 204 and/or trapezoid-shaped metal traces 226 is illustrated. By giving the landing pad 204 the shape of a trapezoid (or a similar shape), the embodiment package 200 enjoys good trace adhesion at the bump on trace (BOT) interconnection 212. Moreover, the bump to trace distance 232 shown in FIG. 10 may also remain relatively small, which allows for a smaller overall package 200. Even so, the joint area 234 between the landing pad 204 and the conductive material 52 remains relatively large because of the wider contact area provided by the landing pad 204 relative to the much narrower metal trace 226. The large joint area 234 mitigates or eliminates joint fatigue and helps prevent solder cracks in the embodiment package 200.

Figure 11:
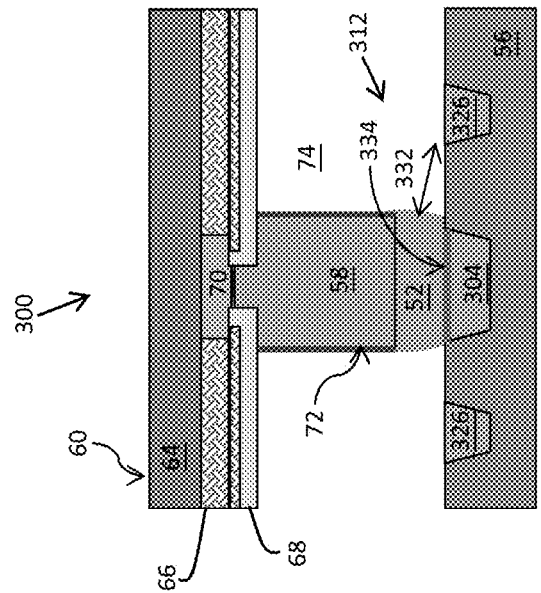
FIG. 11 illustrates a cross section of an embodiment package having an embedded patterning process (EPP) substrate with a landing pad overlapping each inverted trapezoid-shaped metal trace.

Referring now to FIG. 11, an embodiment package 300 having an inverted trapezoid-shaped landing pad 304 and/or inverted trapezoid-shaped metal traces 326 is illustrated. By giving the landing pad 304 the shape of an inverted trapezoid (or a similar shape), the embodiment package 300 is less prone to, for example, joint failure at the bump on trace (BOT) interconnection 312. Moreover, the bump to trace distance 332 shown in FIG. 11 may also remain relatively small, which allows for a smaller overall package 300. Even so, the joint area 334 between the landing pad 304 and the conductive material 52 remains relatively large because of the wider contact area provided by the landing pad 304 relative to the much narrower metal trace 326. The large joint area 334 mitigates or eliminates joint fatigue and helps prevent solder cracks in the embodiment package 300.

Referring now to FIGS. 12-13, in an embodiment a joint enhancement feature 400 may be formed or deposited on or over the landing pad 54. The joint enhancement feature 400 enlarges the joint area to mitigate or prevent, for example, solder cracks. In addition, the joint enhancement feature 400 reduces the interconnect resistance and/or metal bump stress in the embodiment package 50 to improve electro migration (EM) and joint fatigue, respectively.

As shown in FIG. 12, the joint enhancement feature 400 may have an "H" shape. In such an embodiment, a width 402 of each leg 404 (i.e., line) of the H shaped joint enhancement feature 400 is about five micrometers (5 μm) and the space 406 between the legs 404 is also about five micrometers (5 μm). Even so, other dimensions are contemplated and the width 402 of the legs 404 and the space 406 between them may be larger or smaller in other embodiments.

In an embodiment, a width 408 of the joint enhancement feature 400 is about eighty percent (80%) of the width 78 of the landing pad 54. In an embodiment, a length 410 of the joint enhancement feature 400 is about eighty percent (80%) of the length 88 of the landing pad 54. Even so, the ratio of features of the joint enhancement feature 400 relative to the landing pad 54 may be larger or smaller in other embodiments.

Referring now to FIG. 13, the joint enhancement feature 400 projects or extends into the conductive material 52. As such, the joint enhancement feature 400 provides additional surface area to generate a robust bump on trace (BOT) interconnection 412. In addition, because the joint enhancement feature 400 is raised relative to the underlying landing pad 54, the bump on trace (BOT) interconnection 412 resists lateral movement and failures caused by such lateral shifting.

Figure 15:
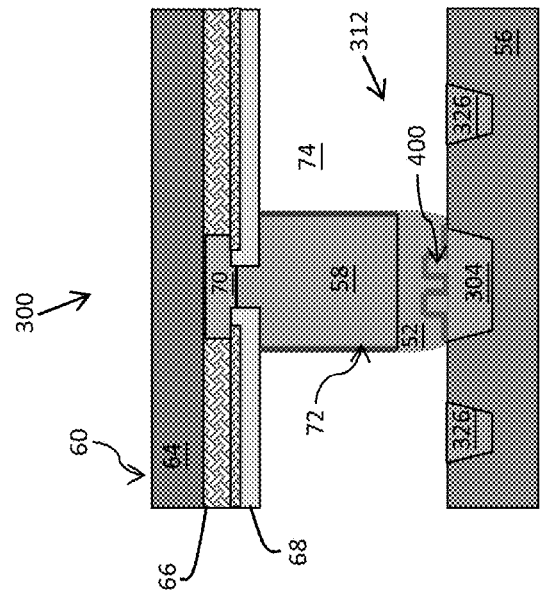
FIG. 15 illustrates a cross section of an embodiment package having an embedded patterning process (EPP) substrate with a joint enhancement layer formed over the landing pad overlapping each inverted trapezoid-shaped metal trace.
Figure 14:
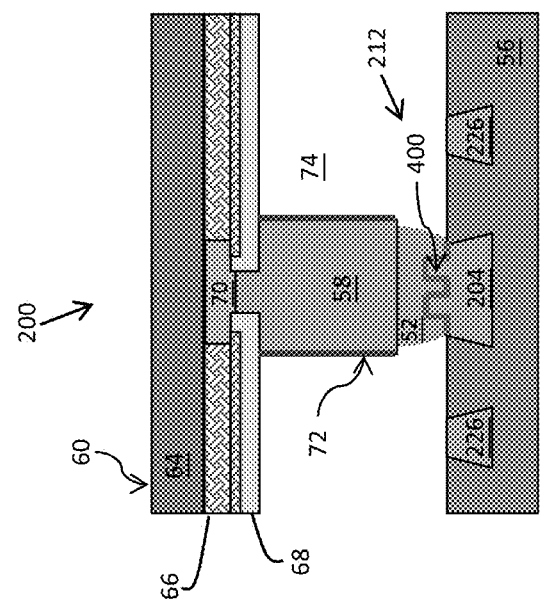
FIG. 14 illustrates a cross section of an embodiment package having an embedded patterning process (EPP) substrate with a joint enhancement layer formed over the landing pad overlapping each trapezoid-shaped metal trace.

Referring now to FIGS. 14-15, the embodiment package 200 of FIG. 10 and the embodiment package 300 of FIG. 11 have each been equipped with the joint enhancement feature 400. Indeed, the joint enhancement feature 400 has been formed over or upon the trapezoid landing pad 204 in FIG. 14 and the inverted trapezoid landing pad 304 in FIG. 15.

Figure 16:
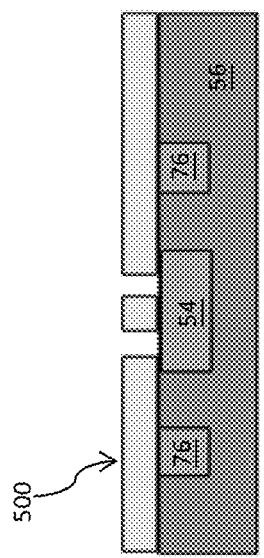
FIGS. 16-18 collectively illustrate a process flow for use in forming the joint enhancement layer depicted in FIG. 12 (top view of the joint enhancement layer) and in FIGS. 13-15 (cross section of the joint enhancement layer).
Figure 17:
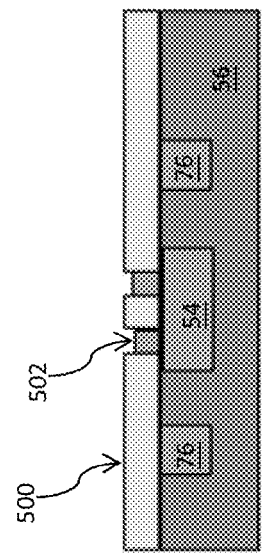
Figure 18:
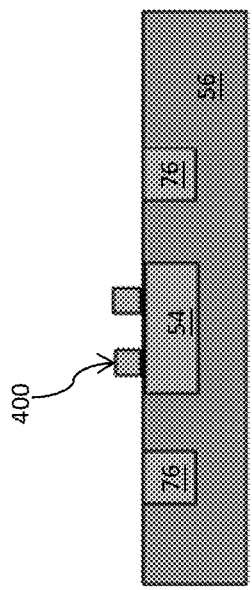

Referring now to FIGS. 16-18, a process flow for use in forming the joint enhancement layer 400 depicted in FIG. 12 (top view) and in FIGS. 13-15 (cross section views) is collectively illustrated. In FIG. 16, a lithography process is utilized to pattern a photo resist 500 disposed over the landing pad 54 and the adjacent traces 76 in the embedded patterning process (EPP) substrate 56. As shown in FIG. 16, the photo resist 500 has been patterned to expose the landing pad 54.

In FIG. 17, a metal plating process is utilized to deposit metal 502 in the photo resist 500 where patterned. As such, the metal 502 is formed over the exposed portions of the landing pad 54 depicted in FIG. 16. In an embodiment, the metal 502 deposited in the patterned photo resist 500 is copper in the form of copper plating. However, other suitable metals may be used in other embodiments.

In FIG. 18, the photo resist 500 is stripped away. In an embodiment, the photo resist 500 is stripped away by wet etching. Even so, in other embodiments the photo resist may be otherwise removed. As shown in FIG. 18, when the photo resist 500 is removed the joint enhancement feature 400 as shown in, for example, FIGS. 12-13 remains. It should be recognized that the same or a similar process as illustrated in FIGS. 16-18 may also be used to form the joint enhancement feature 400 of FIGS. 14-15 as well. In addition, additional processing steps not illustrated in FIGS. 16-18 may be employed.

From the foregoing it should be recognized that the embodiment package 50 of FIG. 5 provides advantageous features. For example, the landing pads 54 permit the package 50 to support an interconnect pitch reduction. Indeed, the design of the embodiment package 50 not only enlarges the assembly window, but also prevents the solder from cracking during the bonding process or a reliability test. In addition, the package 50 reduces the potential for trace bridge failure. Even so, the package 50 allows for an enlarged distance between the conductive pillar to nearby adjacent metal traces.

Further, the package 50 layout permits the metal traces to be formed more closely together with the same process capability. Therefore, an aggressive approach to the metal spacing rule can be taken. The package 50 also provides lower electrical resistivity, better electro-migration (EM) resistance, and a reduced interconnect resistance-capacitance (RC) delay relative to conventional packages. Still further, the package 50 offers less opportunity for metal trace peeling due to the wider landing pads.

An embodiment package includes an integrated circuit supporting a conductive pillar, a substrate having a landing pad on each embedded metal trace, a landing pad width greater than a corresponding embedded metal trace width, and a conductive material electrically coupling the conductive pillar to the landing pad. In an embodiment, the landing pad overlaps the metal trace in one direction.

An embodiment package includes an integrated circuit chip supporting a metal bump, a substrate having a landing pad for each metal trace, the landing pad overlapping the metal trace in one direction, and a conductive material electrically coupling the metal bump to the landing pad.

An embodiment method of forming a package includes forming a landing pad for each embedded metal trace in a substrate, a pad width greater than a corresponding trace width, and electrically coupling a conductive pillar of an integrated circuit chip to the landing pad.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A package, comprising:
   an integrated circuit chip supporting a conductive pillar;
   a substrate having an embedded landing pad coupled to an embedded metal trace, wherein a surface of the embedded landing pad is co-planar with a surface of the embedded metal trace, and wherein an embedded landing pad width is greater than an embedded metal trace width, and wherein an embedded landing pad length is greater than the embedded landing pad width, and wherein the embedded landing pad and the embedded metal trace have an upper surface co-planar with an upper surface of the substrate, the embedded metal trace having a trapezoid cross section;
   a joint enhancement feature extending from the embedded landing pad, the joint enhancement feature having an "H" shape, wherein the "H" shape is the only raised feature extending from the embedded landing pad; and
   a solder joint electrically coupling the conductive pillar to the embedded landing pad.

2. The package of claim 1, wherein the substrate has a plurality of embedded landing pads, and wherein adjacent ones of the plurality of embedded landing pads are staggered.

3. The package of claim 1, wherein a metal oxide is disposed on sidewalls of the conductive pillar.

4. The package of claim 1, wherein the embedded landing pad width is less than a conductive pillar width.

5. The package of claim 1, wherein an embedded landing pad length is between about seventy percent of a conductive pillar length and about one hundred thirty percent of the conductive pillar length.

6. The package of claim 1, wherein at least one of a molding compound and an underfill material is disposed around the conductive pillar and between the integrated circuit and the substrate.

7. The package of claim 1, wherein the substrate is an embedded patterning process substrate and the solder joint also electrically couples the conductive pillar to the embedded metal trace.

8. The package of claim 1, wherein the embedded landing pad has a shape selected from the group consisting of a rectangle, a square, a triangle, a trapezoid, a hexagon, an octagon, an ellipse, a ladder shape, a diamond, a rounded rectangle, a double trapezoid, a capsule, an oval, and a hexagon-ended rectangle.

9. The package of claim 1, wherein a width of the embedded metal trace along a surface of the substrate is less than a width of the embedded metal trace below the surface of the substrate.

10. A package, comprising:
    a first substrate having a first conductive structure disposed thereon;
    a second substrate having a second conductive structure embedded therein, the second conductive structure having a trapezoid shape, the second conductive structure comprising a first element having a first width and a second element coplanar with the first element, the second element having a second width larger than the first width, the second element having a length greater than the second width, wherein the first element and the second element extend from an uppermost surface of the second substrate to below the uppermost surface of the second substrate;
    a solder joint electrically coupling the first conductive structure to the second element of the second conductive structure; and
    a joint enhancement feature extending from the second element, the joint enhancement feature having an "H" shape, wherein the "H" shape is the only raised feature extending from the second element, the solder joint surrounding the joint enhancement feature in a plan view.

11. The package of claim 10, wherein the second substrate has a plurality of second elements, and wherein adjacent ones of the plurality of second elements are staggered.

12. The package of claim 10, wherein the first conductive structure comprises copper and a copper oxide is disposed on sidewalls of the first conductive structure and a length of the second element is between about seventy percent of a length of the first conductive structure to about one hundred thirty percent of the length of the first conductive structure.

13. The package of claim 10, wherein the second substrate is an embedded patterning process substrate.

14. The package of claim 10, wherein the second width is less than a width of the first conductive structure.

15. The package of claim 10, wherein an underfill material is disposed around the first conductive structure and between the first substrate and the second substrate.

16. The package of claim 10, wherein the trapezoid shape is an inverted trapezoid shape.

17. A method of forming a package, comprising:
    forming an embedded landing pad and an embedded metal trace in a substrate, wherein the embedded metal trace is coplanar with the embedded landing pad, and wherein a width of the embedded landing pad is greater than a width of the embedded metal trace, wherein a periphery of an uppermost surface of the embedded landing pad and the embedded metal trace is coplanar with an upper surface of the substrate;
    forming a joint enhancement feature over the embedded landing pad, the joint enhancement feature having an "H" shape, wherein the "H" shape is the only raised feature extending from the embedded landing pad; and
    soldering conductive material to electrically couple a conductive pillar of an integrated circuit chip to the embedded landing pad.

18. The method of claim 17, further comprising at least one of staggering adjacent ones of the embedded landing pads and permitting a metal oxide to form on sidewalls of the conductive pillar.

19. The method of claim 17, wherein the forming the joint enhancement feature comprises:
    forming a patterned mask over the substrate, the patterned mask having an opening over the embedded landing pad;
    forming the joint enhancement feature in the opening; and
    removing the patterned mask.

* * * * *